(12) United States Patent
Cox et al.

(10) Patent No.: US 9,721,820 B2
(45) Date of Patent: Aug. 1, 2017

(54) END EFFECTOR FOR TRANSFERRING A SUBSTRATE

(71) Applicant: Applied Materials, Inc., Santa Clara, CA (US)

(72) Inventors: Michael S. Cox, Gilroy, CA (US); Michel Anthony Rosa, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 372 days.

(21) Appl. No.: 14/336,650

(22) Filed: Jul. 21, 2014

(65) Prior Publication Data

US 2015/0022935 A1 Jan. 22, 2015

Related U.S. Application Data

(60) Provisional application No. 61/856,946, filed on Jul. 22, 2013.

(51) Int. Cl.
*H01L 21/683* (2006.01)
*H01L 21/677* (2006.01)

(52) U.S. Cl.
CPC .... *H01L 21/6831* (2013.01); *H01L 21/67742* (2013.01)

(58) Field of Classification Search
CPC ........... H01L 21/67742; H01L 21/6831; H01L 21/6833; H05K 1/0306; H05K 1/162; H05K 3/10; H05K 2201/017; H05K 2201/068; H05K 2201/09236; H05K 2201/09254; H05K 2203/0195; H05K 2203/1338; Y10T 29/49155

USPC ......................................................... 361/234
See application file for complete search history.

(56) References Cited

U.S. PATENT DOCUMENTS

| | | | |
|---|---|---|---|
| 4,751,609 A | 6/1988 | Kasahara | |
| 5,700,046 A | 12/1997 | Van Doren et al. | |
| 5,789,843 A | 8/1998 | Higuchi et al. | |
| 6,055,150 A | 4/2000 | Clinton et al. | |
| 7,804,675 B2 | 9/2010 | Poh | |
| 8,125,756 B2 | 2/2012 | Poh | |
| 8,320,099 B2 | 11/2012 | Hirahara et al. | |
| 2007/0215049 A1* | 9/2007 | Aderhold .......... | H01L 21/67115 118/728 |
| 2009/0284894 A1 | 11/2009 | Cooke | |
| 2010/0104403 A1 | 4/2010 | Cho et al. | |

(Continued)

FOREIGN PATENT DOCUMENTS

JP 10-92917 A 4/1998

OTHER PUBLICATIONS

PCT international search report and written opinion of PCT/US2014/047297 dated Nov. 11, 2014. The PCT search report is being used as the English translation for the Japan reference.

*Primary Examiner* — Thienvu Tran
*Assistant Examiner* — Kevin J Comber
(74) *Attorney, Agent, or Firm* — Patterson + Sheridan, LLP

(57) ABSTRACT

Embodiments of the present invention provide an end effector capable of generating an electrostatic chucking force to chuck a substrate disposed therein without damaging the substrate. In one embodiment, an end effector for a robot, the end effector includes a body having an electrostatic chucking force generating assembly, and a mounting end coupled to the body, the mounting end for coupling the body to the robot.

19 Claims, 7 Drawing Sheets

(56) References Cited

U.S. PATENT DOCUMENTS

| | | |
|---|---|---|
| 2010/0178139 A1 | 7/2010 | Sundar et al. |
| 2011/0102965 A1* | 5/2011 | Fujisawa ............. H01L 21/6833 |
| | | 361/234 |
| 2012/0033340 A1 | 2/2012 | Roy et al. |
| 2013/0001899 A1 | 1/2013 | Hwang et al. |
| 2013/0088809 A1 | 4/2013 | Parkhe et al. |
| 2013/0135784 A1 | 5/2013 | Kao et al. |

* cited by examiner

END EFFECTOR FOR TRANSFERRING A SUBSTRATE

CROSS-REFERENCE TO RELATED APPLICATIONS

This application claims benefit of U.S. Provisional Application Ser. No. 61/856,946 filed Jul. 22, 2013, which is incorporated by reference in its entirety.

BACKGROUND OF THE INVENTION

Field of the Invention

Embodiments of the invention generally relate to an end effector configured to transfer a substrate, more specifically, for an end effector configured to transfer a thin substrate using an electrostatic chucking force.

Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors. A CMOS transistor has a gate structure comprising a polysilicon gate electrode and gate dielectric, and is disposed between a source region and drain regions that are formed in the substrate.

During manufacture of the integrated circuits, display devices or other semiconductor related products, a number of different chemical and physical processes are involved whereby minute transistor devices are created on a substrate. Layers of materials which make up the transistor devices are created by chemical vapor deposition, physical vapor deposition, epitaxial growth, and the like. Some of the layers of material are patterned using photoresist masks and wet or dry etching techniques. The substrate utilized to form transistor devices may be silicon, quartz, sapphire, gallium arsenide, indium phosphide, glass, or other appropriate material. In some applications, flexible substrates, polymer substrates or plastic substrates may also be utilized.

During processing, the substrate needs to be transferred in between processing tools and chambers. After a number of processes, the substrate may be thinned compared to its original substrate thickness. For example, a portion of the substrate may be grounded or polished away during the processes, thereby resulting thickness loss to the substrate. When a substrate thickness is thinned down to 100 µm or less, it becomes fragile. It has become more challenging in transferring these thin substrates during processes without damaging or fragmenting the substrates. Using a conventional mechanical end effector to clamp a fragile substrate during transfer may often result in substrate damage due to the high mechanical clamping and contact force. Furthermore, for the substrates used for smart phones, LED or solar cell applications, small size substrates are often selected for manufacture. It even increases difficulty in transferring the fragile substrates with small sizes.

In some cases, the substrates may need to be flipped over, e.g., inverted, to process the substrate from their backside, a surface without transistor or devices formed thereon. Examples of these processes include through silicon vias (TSVs), substrate backside grounding, or substrate backside cleaning or scrubbing. In these applications, minimum physical contact for the end effector to be in contact with the substrate is desired so as to avoid contamination or physical damage during substrate contact for transferring. However, conventional mechanical transfer often requires a certain degree of physical contact for the end effector to the substrate so as to ensure a sufficient clamping force applied thereto to securely pick up the substrate. This mechanical contact inevitably creates contact contamination or physical damage, undesirably polluting the substrate.

Therefore, there is a need for an apparatus for transferring thin substrates with minimum contact.

SUMMARY OF THE INVENTION

Embodiments of the present invention provide an end effector capable of providing electrostatic chucking force during transfer. The electrostatic chucking force provided from the end effector during transfer may efficiently chuck the substrate on the end effector without damaging and contaminating the substrate. In one example, the end effector may be configured to transfer a substrate from the front surface of the substrate, a surface where the devices or transistors are formed on, with minimum contact area.

In one embodiment, an end effector for a robot, the end effector includes a body having an electrostatic chucking force generating assembly, and a mounting end coupled to the body, the mounting end for coupling the body to the robot.

In another embodiment, a method for holding a substrate on an end effector includes receiving a substrate on an end effector in a processing system, and generating an electrostatic chucking force from the end effector to chuck the substrate on the end effector.

In yet another embodiment, a processing system includes a processing system, an end effector disposed in the processing system, an electrostatic chucking force generating assembly disposed in the end effector, wherein the electrostatic chucking force generating assembly includes a plurality of interleaving electrode fingers forming an electrode assembly, and an encapsulating member having a first surface disposed on the electrode assembly and a second surface configured to be in contact with a substrate positioned thereon.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings.

FIG. 7 depicts a processing system where an end effector with the electrostatic chucking force generating assembly may be utilized in.

Figure 1:
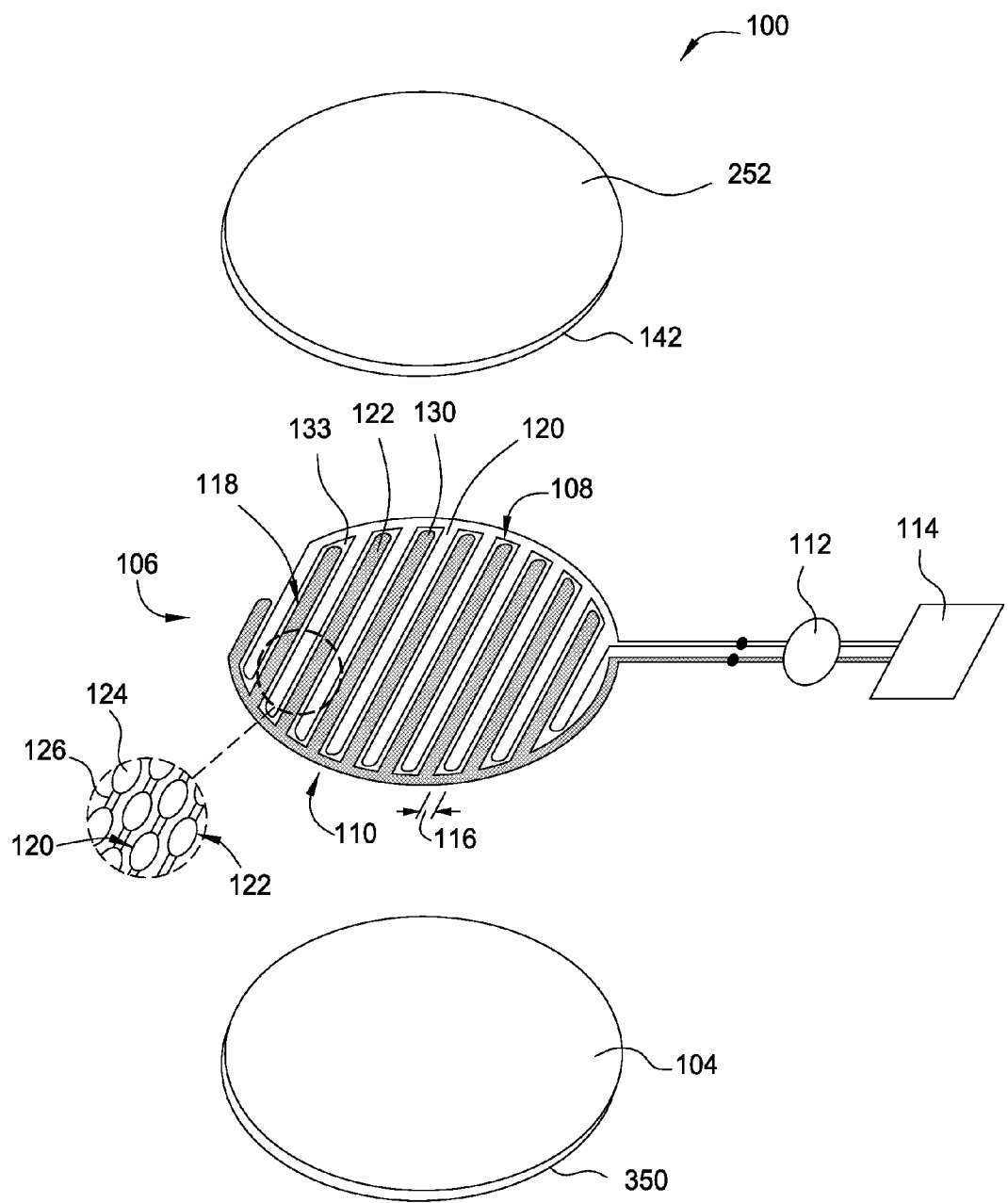
FIG. 1 depicts an exploded view of one embodiment of an electrostatic chucking force generating assembly according the present invention.

It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures. It is contemplated that elements of one embodiment may be advantageously utilized in other embodiments without further recitation.

DETAILED DESCRIPTION

Embodiments of the present invention provide an end effector capable of generating an electrostatic chucking force to chuck a substrate disposed therein without damaging the substrate. In one embodiment, the end effector includes an electrostatic chucking force generating assembly comprising an electrode assembly sandwiched between two insulating materials. The two insulating materials may be made from polymer, ceramic or glass. By using electrostatic chucking force to chuck a substrate during transfer, instead of a conventional mechanical clamping force, the substrate may be securely transferred without damaging or contaminating the substrate.

FIG. 1 depicts an exploded view of one embodiment of electrostatic chucking force generating assembly 100 that may be utilized to form an end effector. The electrostatic chucking force generating assembly 100 may be embedded in a robot end effector using any suitable processes, which will be described below with referenced to FIG. 7. Although one embodiment of the electrostatic chucking force generating assembly 100 described here is disposed in an end effector, it is contemplated that the electrostatic chucking force generating assembly 100 may be adapted for use in other applications.

The electrostatic chucking force generating assembly 100 includes a rigid support base 104, an electrode assembly 106 disposed on the rigid support base 104, and an encapsulating member 102 disposed on the electrode assembly 106. The rigid support base 104 may have any suitable shapes selected for handling a specific workpiece, and in the illustrative example depicted in FIG. 1, the rigid support base 104 has a circular-like shape having a periphery 132 that substantially matches the shape and size of electrode assembly 106 and the rigid support base 104 sequentially formed thereon to allow a substrate with similar shape and size to be disposed thereon. It is noted that the rigid support base 104, the electrode assembly 106 and the encapsulating member 102 may have any alternative shapes or configurations as needed. For example, although the electrostatic chucking force generating assembly 100 is shown with a circular profile, it is contemplated that the profile of the electrostatic chucking force generating assembly 100 may be altered to conform or confine the geometric boundaries of structures having shapes, such as the robotic end effectors, illustrated in FIGS. 2A-2B, 3, 5, and 6 below.

In one embodiment, the rigid support base 104 may be fabricated from an insulating material, such as a dielectric material or a ceramic material. Suitable examples of the ceramic materials or dielectric materials include polymers (i.e., polyimide), silicon oxide, such as quartz or glass, aluminum oxide ($Al_2O_3$), aluminum nitride (AlN), yttrium containing materials, yttrium oxide ($Y_2O_3$), yttrium-aluminum-garnet (YAG), titanium oxide (TiO), titanium nitride (TiN), silicon carbide (SiC) and the like. Optionally, the rigid support base 104 may be a metallic body having a dielectric layer disposed on the surface of the base 104 facing the electrostatic assembly 106.

The electrode assembly 106 disposed on the rigid support base 104 includes at least two sets of distributed electrodes 108, 110. Each electrode 108, 110 may be charged with different polarities as needed when a voltage power is applied thereto, thus generating an electrostatic force. The electrodes 108, 110 are configured to distribute the electrostatic force along a distance at least two times with width of the electrostatic chucking force generating assembly 100. Each electrode 108, 110 may each have a plurality of geometric forms interleaved or interposed among each other, shown in FIG. 1 as a plurality of electrode fingers 120, 122 interleaving with each other. It is believed that electrode interleaved fingers 120, 122 provides local electrostatic attraction distributed across a large area of the electrostatic chucking force generating assembly 100 which in the aggregation provides a high chucking force while using less chucking power. The electrode fingers 120, 122 may be formed to have different shapes, lengths and geometry. In one example, one or both of the electrode fingers 120, 122 may be formed from interconnected electrode islands 124. Interconnections 126 between electrode islands 124 may be in the plane of the electrodes 108, 110 as shown in FIG. 1, or out of plane, such as in the form of jumpers and/or vias. In one embodiment, the electrode finger 120, 122 has a width 116 of between about 0.25 mm and about 10 mm.

A power source 114 is coupled to the first and the second electrode 108, 110 through a power switch 112. The power source 114 is configured to provide a voltage power to the first and the second electrode 108, 110 to generate charges with different polarities, either positive or negative charges. The positive or negative charges generated from the first and the second electrode 108, 110 provide an electrostatic force to attract a substrate disposed in the electrostatic chucking force generating assembly 100 in a secured position. In one embodiment, the power source 114 may be configured to provide a DC or AC power to the first and the second electrodes 108, 110.

The encapsulating member 102 is disposed on the rigid support base 104 sandwiching the electrode assembly 106, to form the electrostatic chucking force generating assembly 100 as a unitary structure. The encapsulating member 102 is positioned on the electrode assembly 106 to provide an insulating surface on which the substrate is chucked. The encapsulating member 102 may be fabricated by a material having thermal properties, e.g., coefficient of thermal expansion, substantially matching that of the underlying electrode assembly 106, and in some embodiments, also the rigid support base 104.

After the encapsulating member 102, the electrode assembly 106 and the rigid support base 104 are stacked in a predetermined order, a bonding process, such as an annealing process, is performed to fuse the encapsulating member 102, the electrode assembly 106 and the rigid support base 104 together, forming a laminated structure of the electrostatic chucking force generating assembly 100 as an integral part. As the encapsulating member 102, the electrode assembly 106 and the rigid support base 104 may be required to operate in a high temperature environment, e.g., greater than 300 degrees Celsius, the materials utilized to fabricate these three components may be selected from heat resistance materials, such as ceramic materials or glass materials, that can sustain high thermal treatment during the heat process. In one embodiment, the encapsulating member 102 and the rigid support base 104 may be fabricated from a ceramic material, a glass material, or a composite of ceramic and metal material, providing good strength and durability as well as good heat transfer properties. The materials selected to fabricate the encapsulating member 102 and the rigid support base 104 may have a coefficient of thermal expansion that is substantially matched to the intermediate electrode assembly 106 to reduce thermal expansion mismatch, which may cause stress or failure under high thermal loads. In one embodiment, the coefficient of thermal expansion of the encapsulating member 102 is between about 2 μm/(m*K) and about 8 μm/(m*K). Ceramic materials suitable for fabricating the encapsulating member 102 and the rigid support base 104 may include, but not limited to, silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN). In another embodiment, the encapsulating member 102 and the rigid support base 104 may be fabricated from a composite material includes a different composition of a ceramic and metal, such as metal having dispersed ceramic particles.

In one embodiment, the electrode assembly 106 may be fabricated from a metallic material, such as aluminum silicon alloy, having a coefficient of thermal expansion similar to the adjacent encapsulating member 102 and the rigid support base 104. In one embodiment, the coefficient of thermal expansion of the electrode assembly 106 is between about 4 μm/(m*K) and about 6 μm/(m*K), and is generally within 20 percent of the coefficient of thermal expansion of the encapsulating member 102.

During operation, a negative charge may be applied to the first electrode 108 and a positive charge may be applied to the second electrode 110, or vise versa, to generate an electrostatic force, when a power is supplied to the power source 114. During chucking, the electrostatic force generated from the electrodes 108, 110 chucks and holds the substrate disposed thereon in a secured position. As the power supplied from the power source 114 is turned off, the charges present in the interface 118 between the electrodes 108, 110 may be maintained over a long period of time. To release the substrate held on the electrostatic chuck 100, a short pulse of power in the opposite polarity is provided to the electrodes 108, 110 to remove the charge present in the interface 118.

Figure 2A:
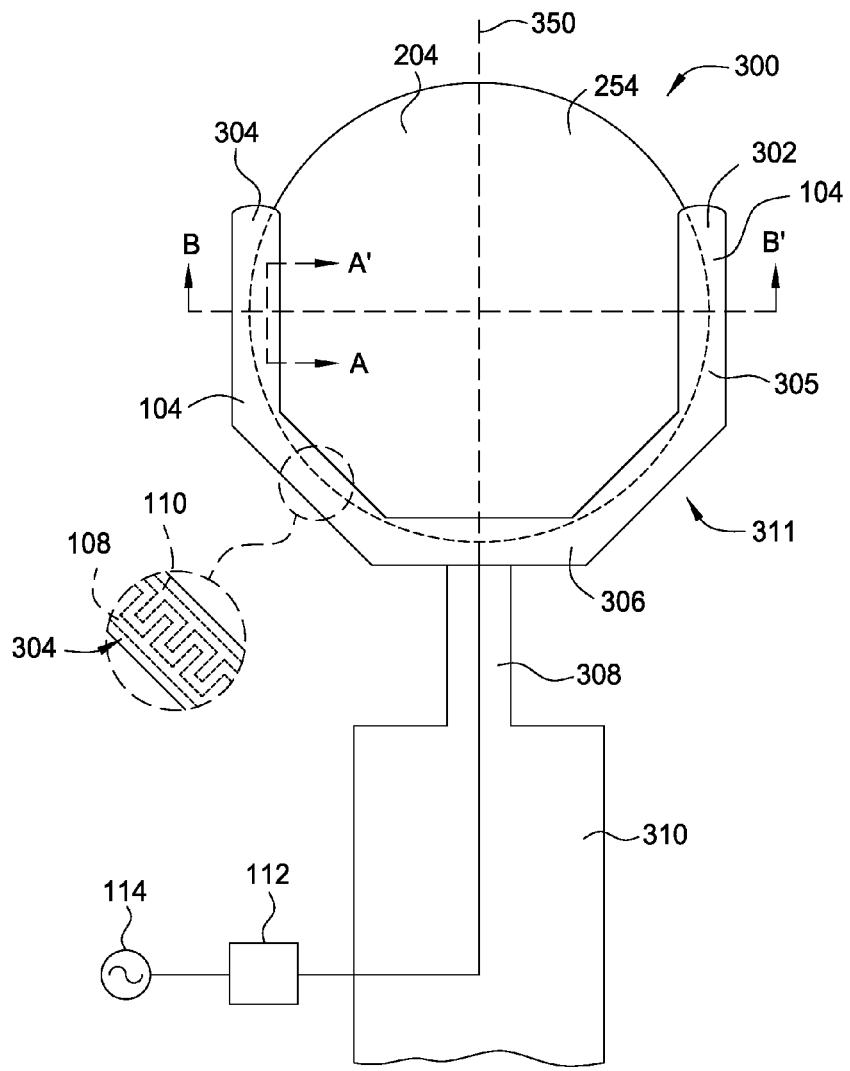
FIG. 2A depicts a bottom view of an end effector assembly with the electrostatic chucking force generating assembly of FIG. 1 utilized therein according the present invention.

FIG. 2A describes a bottom view of one embodiment of an end effector 300 having the electrostatic chucking force generating assembly 100 embedded therein so as to provide an electrostatic chucking force to chuck a substrate disposed thereon during substrate transfer. In one embodiment, the end effector 300 includes a body 311 that is symmetrical about a centerline 350. The centerline 350 of the end effector 307 may also be the centerline of a mounting end 308 attached to the body 311 of the end effector 300.

The body 311 includes two fingers 302, 304 connected by a bottom support 306. The mounting end 308 couples the bottom support 306 to the arms of a transfer robot 310, which may be further disposed in a processing system for transferring the substrate 204 disposed thereon, which will be discussed further in detail with referenced to FIG. 7. The fingers 302, 304 of the end effector 300 are configured to be in contact with a surface 254, e.g., a front surface, of the substrate 204 by an electrostatic chucking force. The front surface 254 of the substrate 204 may have the devices and transistors formed and manufactured thereon. The body 311 may be dimensioned as to contact the front surface 254 in an edge area outward of the center region of the surface 254 in which the devices are formed. The two fingers 302, 304 of the end effector 300 may be formed from the electrostatic chucking force generating assembly 100, as discussed above with referenced to FIG. 1, thereby providing sufficient electrostatic chucking force to chuck the substrate 204. As the embodiment depicted in FIG. 2A is from a bottom view of the end effector 300, a periphery region of the substrate 204 is shielded by the fingers 302, 304 in contact with the substrate 204. The insulating base 104 of the electrostatic chucking force generating assembly 100 are formed as part of the bottom of the fingers 302, 304.

Figure 2B:
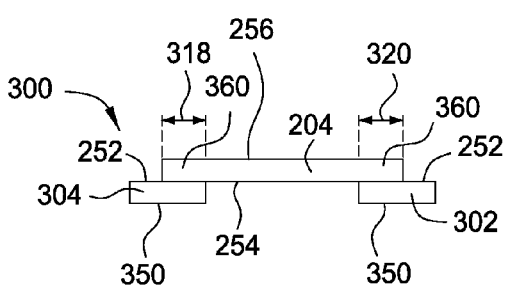
FIG. 2B depicts a cross sectional view of an end effector assembly with the electrostatic chucking force generating assembly of FIG. 1 utilized therein according the present invention.

As the cross sectional view further depicted in FIG. 2B from the cutting along line B-B' of FIG. 2A, the substrate 204 is in contact with the fingers 302, 304 from its edges 360. The substrate 204 is securely positioned on the upper surface 252 of the encapsulating member 102 forming the fingers 302, 304 by the electrostatic chucking force. The upper surface 252 of the fingers 302, 304 may be in contact with any surfaces 254, 256 of the substrate 204 as needed. In the exemplary embodiment depicted in FIGS. 2A-2B, the fingers 302, 304 are in contact with the edges 360 of the front surface 254 of the substrate 204 without damaging or contacting the devices or transistors formed thereon. In one embodiment, the fingers 302, 304 may be contact the edge 360 of the substrate 204 at a width 318, 320 between about 2 mm and about 10 mm from the substrate bevel.

Figure 3:
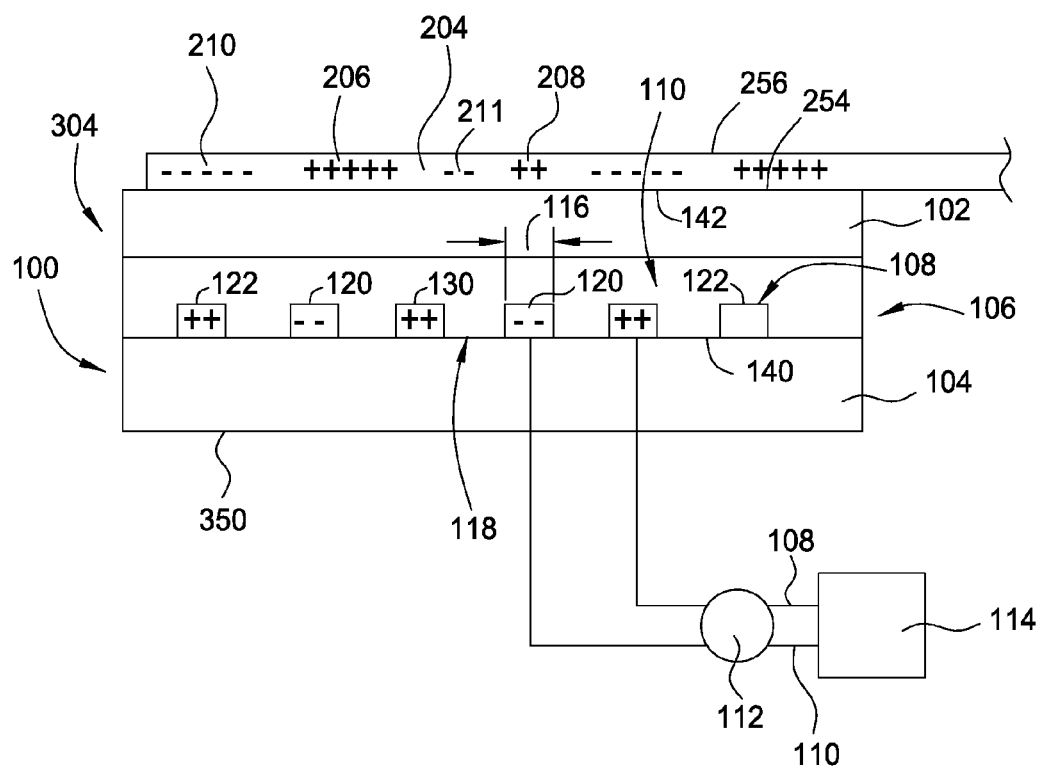
FIG. 3 depicts a cross sectional view of the electrostatic chucking force generating assembly of FIG. 1 according the present invention.

FIG. 3 depicts a cross sectional view of one of the finger 304 taken along section line A-A' of FIG. 2A having the electrostatic chucking force generating assembly 100 formed therein. The electrostatic chucking force generating assembly 100 is formed and implemented in the finger 304 of the end effector 300 depicted in FIG. 2A. It is noted that the electrostatic chucking force generating assembly 100 may be disposed on, embedded, implanted, or installed in any other suitable places, such as a robot blade, end effectors, a substrate support, or any places in a processing chamber where a substrate positioning or transfer is required during processing or transfer. Furthermore, the electrostatic chucking force generating assembly 100 may be used in any suitable processing tools, including those processing equipments working under atmosphere, vacuum or any conditions.

As depicted in the cross sectional view of FIG. 1, the electrode assembly 106 may include the first electrode 108 and the second electrode 110 with interleaving electrode fingers 120, 122 disposed therein. In the example depicted in FIG. 3, a negative charge is applied to the first electrode 108 and a positive charge is applied to the second electrode 110. The negative and positive charges generated from the electrode assembly 106 respectively induce the substrate 204 to generate charges with opposite polarities, i.e., positive charges and negative charges, thereby generating an electrostatic force to chuck the substrate 204 on the finger 304. For example, negative charges on the electrode fingers 122, 120 of the first electrode 108 may induce the substrate 204 to locally generate positive charges 206, 208, so as to create electrostatic force to securely position to the substrate 204 on the finger 304. In contrast, positive charges on the electrode fingers 124, 130 of the second electrode 110 may induce the substrate 204 to locally generate negative charges 210, 211. By utilizing these interleaving finger electrodes 124, 122, 130, 120 of the first and the second electrode 108, 110, an enhanced and localized electrostatic field may be created, generating as electrostatic force in the substrate, helping to retain the substrate 204 on the finger 304 for a longer time after power has been removed, without significantly overcharging the substrate, which may undesirably damage the substrate. The longer chucking time on the substrate 204 may enable the substrate 204 to be retained on the finger 304 without a power supplied to the electrode assembly 106, thereby reducing likelihood of charging defects created on the thin substrate 204 while helping to reduce substrate breakage and damage. The chucking force generated by the electrostatic chucking force generating assembly 100 retaining the substrate 204 may be localized or enhanced by utilizing different sizes, shapes, arrangement, and distribution of the electrode fingers 122, 120 of the first and the second electrode 108, 110.

Figure 4:
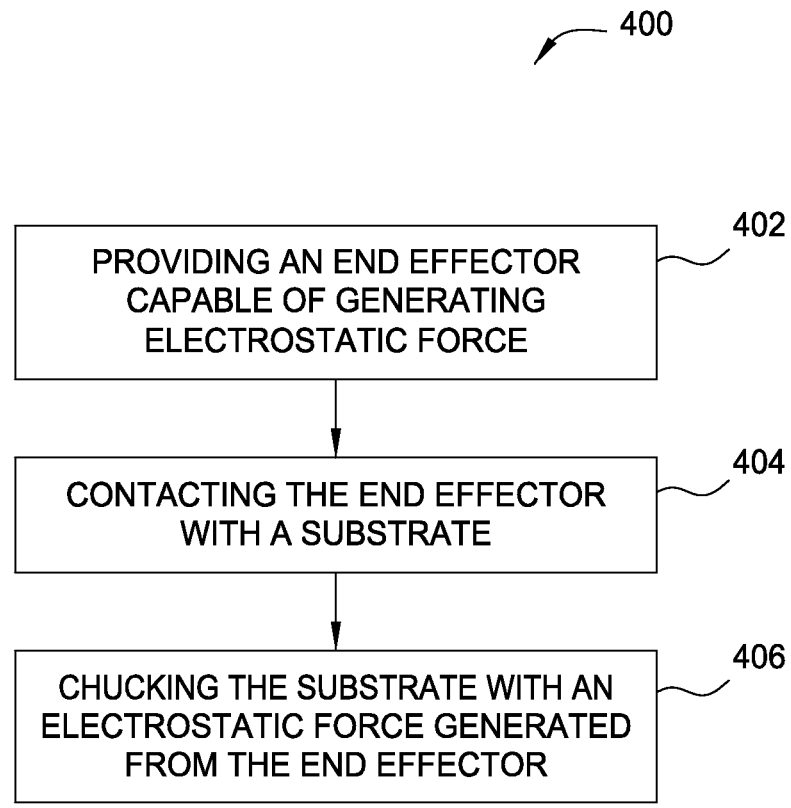
FIG. 4 depicts a flow diagram of a method for transferring a substrate using an electrostatic chucking force provided from an end in accordance with one embodiment of the present invention.

FIG. 4 depicts a flow diagram of a method for utilizing an end effector, such as the end effector 300 depicted in FIG. 2A, having the electrostatic chucking force generating assembly 100 formed therein to transfer a substrate positioned thereon in accordance with one embodiment of the present invention. The end effector 300 may be disposed in a processing system configured to transfer substrate among different processing chambers or among different processing systems as needed. One example of the processing system where the end effector 300 may be disposed will be further discussed below with referenced to FIG. 7.

The method 400 starts at step 402 by providing the end effector 300 having the electrostatic chucking force generating assembly 100 formed therein in a processing system wherein a substrate transfer is required. At step 404, the end effector 300 is then actuated to contact a substrate which is to be transported within the processing system. At step 406, once the substrate is in contact with the electrostatic chucking force generating assembly 100, an AC or DC power is supplied by the power source 114 to generate an electrostatic chucking force between the electrode assembly 106 and the substrate 204 disposed on the end effector 300. By doing so, the substrate may be securely chucked on the end effector by electrostatic chucking force, instead of a conventional mechanical force, thereby eliminating the likelihood of substrate breakage, scratch, or damage due to mechanical clamping.

Figure 5:
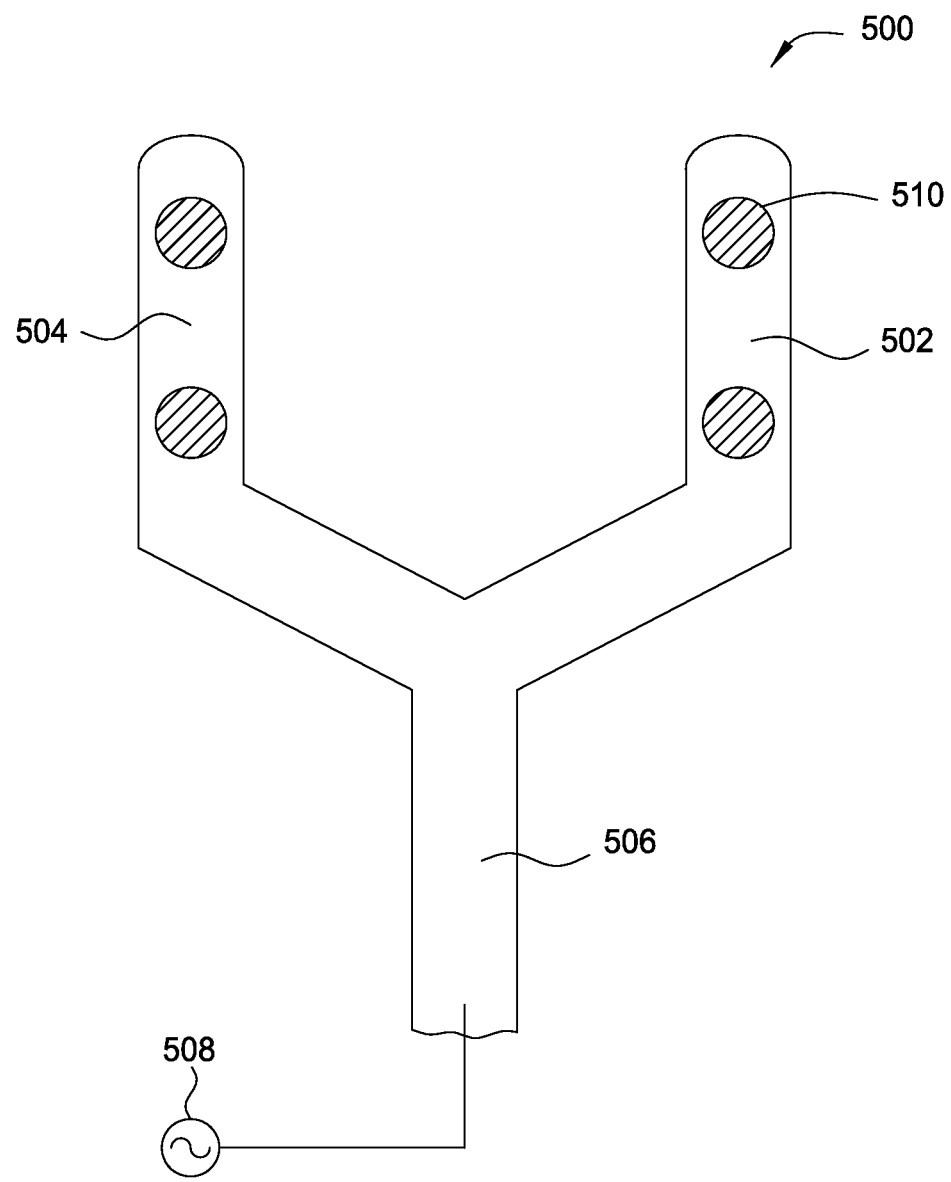
FIG. 5 depicts a top view of another embodiment of an end effector assembly with the electrostatic chucking force generating assembly of FIG. 1 utilized therein according the present invention.
Figure 6:
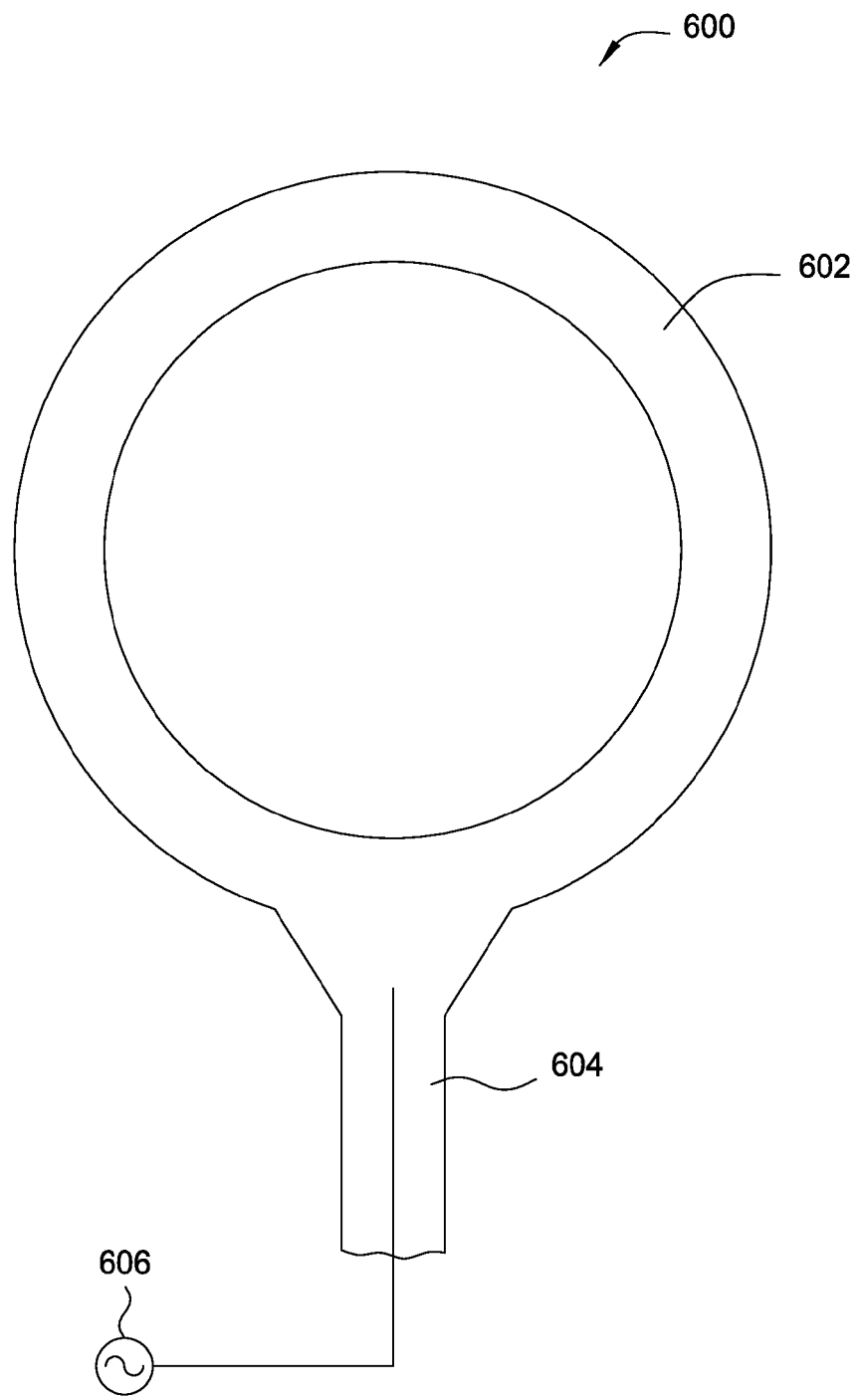
FIG. 6 depicts a top view of yet another embodiment of an end effector assembly with the electrostatic chucking force generating assembly of FIG. 1 utilized therein according the present invention.

FIG. 5 depicts another embodiment of the end effector 500 having the electrostatic chucking force generating assembly 100 disposed on or embedded therein capable of generating electrostatic chucking force to hold a substrate during substrate transfer. Similar to the end effector 300 depicted in FIG. 2A, the end effector 500 depicted in FIG. 5 also includes two fingers 502, 504 jointed by a bottom support 506 and connected to a power source 508. The power source 508 may be similar to the power source 114 described above. Additionally, the end effector 500 may include a plurality of features 510 formed on the fingers 502, 504 so as to assist gripping the substrate on the end effector 500 with a higher fiction, improving the overall gripping force. Suitable examples of the features include grooves, resilient pads, ridges, features or the like. In another example, instead of the configuration of fingers, an ring like end effector 600, as depicted in FIG. 6, may also be utilized. The ring-like end effector 600 includes a ring 602 connected to a bottom support 604. A power source 606 may be connected to the electrostatic chucking force generating assembly 100 disposed in or on the ring 602 of the end effector 600 to actuate the electrostatic chucking force generating assembly 100 disposed, formed or embedded therein to generate an electrostatic chucking force when transferring/holding a substrate. The ring 602 of the end effector 600 may be formed in a size accommodated the size of the substrate to be held thereon. It is noted that the end effectors 500, 600 may further be configured in any shape, such as rectangular, square, U-shape, forked, fingers, paddle, blade, or any other suitable shapes.

Figure 7:
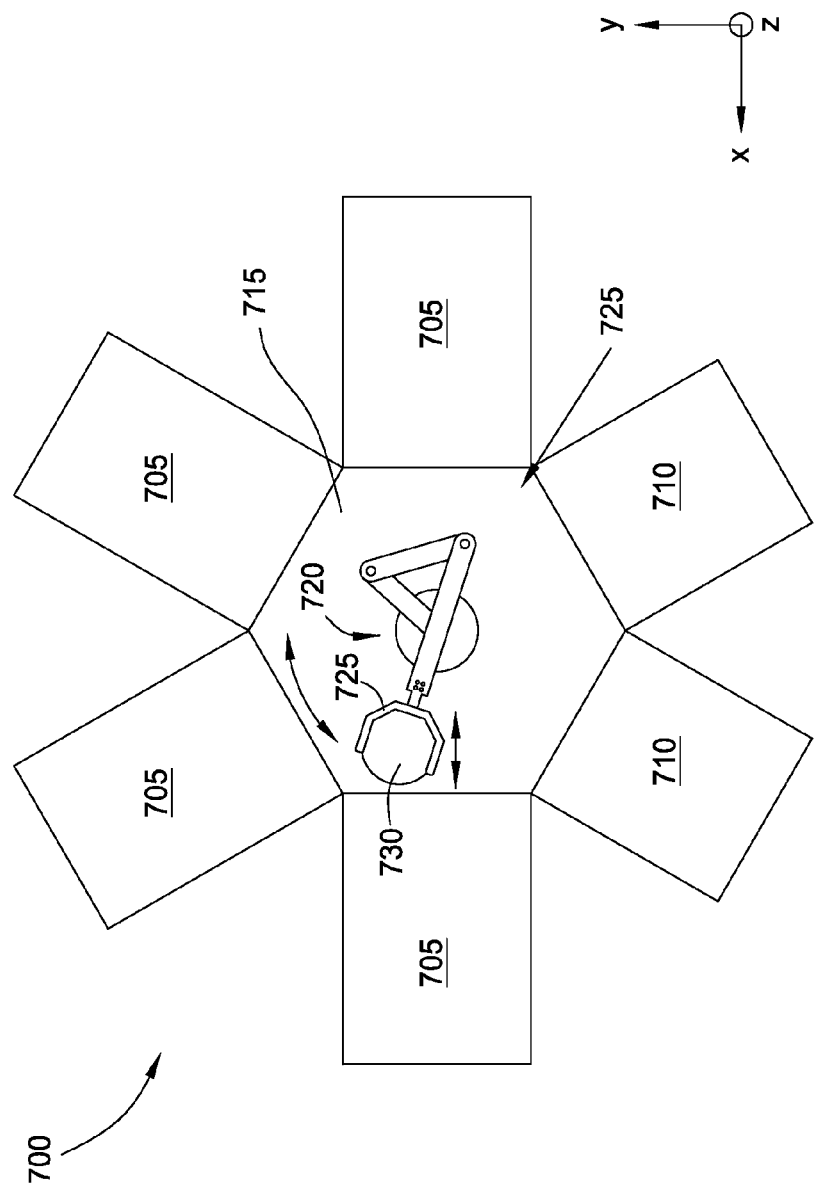

FIG. 7 is a plan view of a multi-chamber substrate processing system 700 suitable for the fabrication of thin-film transistors (TFT), organic light emitting diodes (OLEDS), semiconductor devices or transistors, and solar cell fabrication on flat media having one embodiment of a transfer robot 720 of the present invention. It is contemplated that the transfer robot 720 may be utilized in other processing systems. The transfer robot 720 includes an end effector 725 coupled to its end, which is suitable for transferring a substrate 730 within the processing system 700. Suitable examples of the end effectors 725 may be the end effectors, 300, 500, 600 depicted above with referenced to FIGS. 2A and 5-6 that has the electrostatic chucking force generating assembly 100 formed therein. The end effector 725 may be configured to hold or chuck a substrate 730, such as the substrate 204 depicted above with referenced to FIGS. 2A-2B and 3.

The system 700 includes a plurality of processing chambers 705 and one or more load lock chambers 710 positioned around a central transfer chamber 715. The processing chambers 705 may be configured to complete a number of high temperature processes to achieve a desired processing of flat media, such as a small dimension and thin substrate 730, or other suitable substrate.

Positioned within the central transfer chamber 715 is the transfer robot 720 having the end effector 725. The end effector 725 is configured to be supported by and by moved by the transfer robot. In one embodiment, the transfer robot 720 is configured to rotate the end effector 725 about a central axis and/or move the end effector 725 linearly in a vertical direction. The end effector 725 is also configured to move linearly in a horizontal direction by the transfer robot 720 to extend into and retract from the chambers 705, 710 surrounding the transfer chamber 715 to facilitate substrate transfer between the chambers 705, 710 and 715.

The central transfer chamber 715 is held at a reduced pressure (i.e., vacuum) during processing of substrates. The pressure in the central transfer chamber 715 may be maintained at a pressure lower than ambient pressure (i.e. pressure outside the system 700). The pressure maintained within the central transfer chamber 715 may be substantially equal to the pressure within the processing chambers 705 and/or load lock chambers 710. During substrate processing, the substrate 730 is processed at elevated temperatures within one or more of the processing chambers 705. The substrate 730 is then transferred to one of the load lock chambers 710 by the transfer robot 720 for cooling before being removed from the processing system 700.

Thus, an end effector having an electrostatic chucking force generating assembly formed, embedded, installed, or implemented therein. The electrostatic chucking force generating assembly formed in the end effector generates an electrostatic chucking force to securely hold a substrate positioned thereon during transfer. By utilizing the electrostatic chucking force, a thin or small size substrate may be securely held without damaging, scratching, contaminating or breaking the substrate, which are the defects often found in conventional transfer using a mechanical clamping force, thereby increasing the service components/parts life time.

While the foregoing is directed to embodiments of the present invention, other and further embodiments of the invention may be devised without departing from the basic scope thereof, and the scope thereof is determined by the claims that follow.

What is claimed is:

1. An end effector for a robot, the end effector comprising:
a body having an electrostatic chucking force generating assembly, wherein the body comprises an electrode assembly having interleaving electrode formed therein and each electrode includes interconnections formed between electrode islands, wherein the interconnections and the electrode islands in combination form the electrode fingers in a longitudinal form, each electrode finger is spaced apart from each other, defining a space therebetween; and
a mounting end coupled to the body, the mounting end for coupling the body to the robot.

2. The end effector of claim 1, wherein the electrostatic chucking force generating assembly further comprises:
an insulating base; and
an encapsulating member having a first surface disposed on the electrode assembly, wherein the encapsulating member is fabricated from a ceramic material or glass.

3. The end effector of claim 2, wherein the ceramic material used to fabricate the encapsulating member is selected from a group consisting of silicon carbide, aluminum nitride, aluminum oxide, yttrium containing materials, yttrium oxide ($Y_2O_3$), yttrium-aluminum-garnet (YAG), titanium oxide (TiO), or titanium nitride (TiN).

4. The end effector of claim 2, wherein the insulating base is one of glass or ceramic.

5. The end effector of claim 1, wherein the electrodes further comprises:
a first electrode interleaved or dispersed among a second electrode.

6. The end effector of claim 1, wherein the body comprises:
two fingers each including a portion of the electrode assembly disposed in the body, wherein the fingers each has the interconnection formed between the electrode islands.

7. The end effector of claim 1, wherein the body is a ring.

8. The end effector of claim 6, wherein the finger is configured to contact an edge of a substrate positioned thereon.

9. The end effector of claim 2, wherein the electrode assembly includes a first electrode and a second electrode, each first and the second electrode having a plurality of interleaving electrode fingers having the interconnections formed between the electrode islands.

10. The end effector of claim 8, wherein the end effector is configured to contact the substrate from the edge of a substrate front surface.

11. A method for holding a substrate on an end effector, comprising:
receiving a substrate on an end effector in a processing system; and
generating an electrostatic chucking force from the end effector to chuck the substrate on the end effector, wherein the end effector comprises an electrode assembly formed therein and each electrode includes interconnections formed between electrode islands, wherein the interconnections and the electrode islands in combination form the electrode fingers in a longitudinal form, each electrode finger is spaced apart from each other, defining a space therebetween.

12. The method of claim 11, wherein the electrode assembly comprises interleaving electrodes.

13. The method of claim 11, wherein generating the electrostatic chucking force further comprising:
applying an AC or DC power to the electrode assembly disposed in the end effector to generate the electrostatic chucking force.

14. The method of claim 11, wherein generating the electrostatic chucking force further comprising:
applying a power to the electrode assembly disposed in the end effector; and
generating charges with different polarities from the electrode assembly.

15. The method of claim 11, wherein the electrode assembly includes an encapsulating member having a first surface disposed on an electrode assembly that includes a plurality of interleaving electrode fingers.

16. The method of claim 15, wherein the encapsulating member has a ceramic or glass surface configured to contact with the substrate.

17. The method of claim 11, wherein receiving the substrate on the end effector further comprises:
receiving the substrate from a front surface of the substrate where transistor or devices are formed on.

18. A processing system, comprising:
a processing system;
an end effector disposed in the processing system;
an electrostatic chucking force generating assembly disposed in the end effector, wherein the electrostatic chucking force generating assembly includes a plurality of interleaving electrode fingers forming an electrode assembly and each electrode finger includes interconnections formed between electrode islands, wherein the interconnections and the electrode islands in combination form the electrode fingers in a longitudinal form, each electrode finger is spaced apart from each other, defining a space therebetween; and
an encapsulating member having a first surface disposed on the electrode assembly and a second surface configured to be in contact with a substrate positioned thereon.

19. The processing system of claim 18, wherein the encapsulating member is a ceramic or a glass material.

* * * * *

UNITED STATES PATENT AND TRADEMARK OFFICE
CERTIFICATE OF CORRECTION

PATENT NO. : 9,721,820 B2
APPLICATION NO. : 14/336650
DATED : August 1, 2017
INVENTOR(S) : Michael S. Cox et al.

It is certified that error appears in the above-identified patent and that said Letters Patent is hereby corrected as shown below:

In the Specification

In Column 4, Line 39, below "about 10 mm." insert -- Between each of the electrode fingers 120 of the first electrode 108, spaces 133 are defined to receive electrode fingers 122 of the second electrode 110. The spaces 133 may be an air gap, filled with a dielectric spacer material, or filled with at least one of the rigid support base 104 or encapsulating member 102. --.

Signed and Sealed this
Third Day of October, 2017

Joseph Matal
*Performing the Functions and Duties of the*
*Under Secretary of Commerce for Intellectual Property and*
*Director of the United States Patent and Trademark Office*